United States Patent
Kanamitsu et al.

(10) Patent No.: US 7,180,788 B2
(45) Date of Patent: Feb. 20, 2007

(54) NONVOLATILE SEMICONDUCTOR MEMORY DEVICE

(75) Inventors: Kenji Kanamitsu, Hitachinaka (JP); Tetsuo Adachi, Hitachinaka (JP); Masataka Kato, Abiko (JP); Keiichi Haraguchi, Hitachinaka (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/030,152

(22) Filed: Jan. 7, 2005

(65) Prior Publication Data

US 2005/0162885 A1     Jul. 28, 2005

(30) Foreign Application Priority Data

Jan. 23, 2004    (JP)    ............................. 2004-015369

(51) Int. Cl.
GIIC 16/04    (2006.01)

(52) U.S. Cl. .............................. 365/185.28; 365/185.13
(58) Field of Classification Search ............ 365/185.28
See application file for complete search history.

(56) References Cited

U.S. PATENT DOCUMENTS 5,117,389 A * 5/1992 Yiu ........................... 365/104
5,717,636 A * 2/1998 Dallabora et al. ...... 365/185.13

FOREIGN PATENT DOCUMENTS

JP    2001-128428    5/2001
JP    2001-176275    6/2001

* cited by examiner

Primary Examiner—Thong Q. Le
(74) Attorney, Agent, or Firm—Antonelli, Terry, Stout and Kraus, LLP.

(57) ABSTRACT

A non-volatile semiconductor memory device provides for higher integration by reducing the area of occupation of direct peripheral circuits, in which the memory cell of an AND type flash memory includes a selection gate, a float gate, a control gate that functions as a word line, and an n-type semiconductor region (source, drain) that functions as a local bit line. A pair of local bit lines adjacent to each other in a memory mat are connected with one global bit line at one end in the direction of the column of the memory mat, and a selection MOS transistor, formed by one enhancement type MOS transistor and one depletion type MOS transistor; is connected in series with each of the pair of local bit lines. One of the local bit lines is selected by turning the selection MOS transistor on/off.

17 Claims, 7 Drawing Sheets

NONVOLATILE SEMICONDUCTOR MEMORY DEVICE

CROSS REFERENCE TO RELATED APPLICATION

The present application claims priority from Japanese patent application No. 2004-015369, filed on Jan. 23, 2004, the content of which is hereby incorporated by reference into this application.

BACKGROUND OF THE INVENTION

The present invention relates in general to an electrically writable non-volatile semiconductor memory device; and, more particularly, it relates to a technique that is effective for obtaining higher integration in the manufacture of non-volatile semiconductor devices.

For data storing memories having excellent portability, flash memories, which operate as semiconductor non-volatile memories, have been used generally.

A memory array system for flash memories, typically, comprise an NAND type, in which memory cells are connected in series, and an AND type, in which memory cells are connected in parallel. Particularly, since the latter type of system adopts a hot electron writing method, writing is conducted at high speed. In addition, since the memory array is constituted by a parallel connection and not a serial connection, unlike the NAND type, it has the beneficial feature of being less affected by memory information of other memory cells.

For example, Japanese Unexamined Patent Publication No. 2001-128428. (refer to Patent Document 1) discloses an imaginal grounded AND type flash memory, in which a memory cell is constituted of an n-semiconductor region (source, drain) and three gates formed in a p-type well of a semiconductor substrate.

Japanese Unexamined Patent Publication No. 2001-176275. (refer to Patent Document 2) discloses an NOR type non-volatile memory in which bit lines and source lines are respectively arranged hierarchically. The main bit line of the non-volatile memory described in the Patent Document 2. is connected as a pair of two lines (odd number bit line and even number bit line) to one sense amplifier, and reading is carried out separately for the group of memory cells connected with the odd number bit lines and those connected with the even number bit lines. Further, selection for the bit lines is conducted by a transistor (first transistor) connected to each of the odd number bit lines and the even number bit lines, and selection is controlled by a selection gate line. In one embodiment of the Patent Document 2, the first transistor comprises an enhancement transistor and a depletion transistor. According to this constitution, by arranging the normally-on depletion transistor at the intersection between the selection gate line and the auxiliary bit line, it is possible to prevent, on the intersection, formation of a parasitic transistor that turns on/off in response to a potential fluctuation of the selection gate line.

[Patent Document 1] Japanese Unexamined Patent Publication No. 2001-128428

[Patent Document 2] Japanese Unexamined Patent Publication No. 2001-176275

SUMMARY OF THE INVENTION

In an AND type flash memory under development by the present inventors, a memory cell is constituted of an n-type semiconductor region (source and drain) and three gates formed in a p-type well of a semiconductor substrate. The three gates constituting the memory cell include a float gate, a control gate and a selection gate. The selection gate is formed by way of a first gate insulating film (tunnel oxide film) on a p-type well. The float gate is formed between two adjacent selection gates and insulated from the p-type well by way of the first gate insulating film. The float gate and the selection gate are insulated by the insulating film on the side wall of the selection gate, and the float gate and the control gate formed thereover are insulated by a second gate insulating film. The control gate extends in the direction of the row so as to constitute a word line. The selection gate extends in the direction of the column perpendicular to the word line. The n-type semiconductor region (source, drain) is formed in the p-type well below one of the side walls of the selection gate, and it extends in the direction of the column perpendicular to the word line so as to constitute a local bit line. The n-type semiconductor region (source, drain) is used in common with the adjacent memory cells that are connected to the identical word line with the objective of reducing the pitch in the direction of the row.

In the memory cell constituted as described above, since the pitch in the direction of the row (direction of the word line) and the pitch in the direction of the column (direction of the local bit line) can be reduced, although they are three gates (float gate, control gate and selection gate), the area occupied by the memory cell can be reduced greatly.

The memory cells are arranged in the form of a matrix to form a memory array on a semiconductor substrate. So-called direct peripheral circuits, such as a sense amplifier, a word driver and a decoder, for controlling the operation of the memory cell are arranged at the periphery of the memory array. Accordingly, even when the memory cells is constituted as described above to reduce the occupying area thereof, unless the occupying area of the direct peripheral circuits is reduced correspondingly, high integration for the flash memory as a whole, such as an increase in the capacity and a reduction of the chip size, can not be attained.

It is an object of the present invention to provide a technique that is capable of enhancing the higher integration of a non-volatile semiconductor memory device.

The foregoing and other objects, as well as novel features of the invention, will become more apparent from the following descriptions in this specification and the appended drawings.

An outline of typical aspects of the invention, among those disclosed in the present application, is briefly described below.

A non-volatile semiconductor memory device in accordance with the invention comprises plural memory cells situated at respective intersections of plural word lines extending in a first direction of a memory mat and plural local bit lines extending in a second direction perpendicular to the first direction, in which each of the plural memory cells comprise:

a selection gate formed by way of a first insulative film over the main surface of a first conduction type semiconductor substrate;

a source and a drain comprising a second conduction type semiconductor region formed to the semiconductor substrate and constituting a local bit line;

a float gate insulated at a portion thereof from the source and drain by the first insulative film and insulated at another portion thereof from the selection gate by a second insulative film; and a control gate formed by way of a third insulative film over the float gate and constituting a word line, in which the plural local bit lines are connected, repeatedly, at one end of two local bit lines, which are disposed adjacent to each other, to one global bit line at one end of the memory mat, and one of the two local bit lines that are disposed adjacent to each other is selected by a first selection MOS transistor connected to each of the plural local bit lines.

In the non-volatile semiconductor memory device according to the invention, as described above, plural memory mats, each having an identical constitution with that of the memory mat described above, are situated along the second direction, and two local bit lines formed adjacent to each other in one memory mat, among two memory mats disposed adjacent to each other, and two local bit lines, disposed adjacent to each other and formed to the other memory mat, are connected with one global bit line at the boundary between the two memory mats.

In the non-volatile semiconductor memory device according to the invention, as described above, the selection MOS transistor connected to each of the plural local bit lines comprises one enhancement type MOS transistor and one depletion type MOS transistor connected in series with each other, and the arrangement of the enhancement type MOS transistor and the arrangement of the depletion type MOS transistor are opposite to each other between one and the other of two local bit lines disposed adjacent to each other.

The effects obtained by typical features of the invention disclosed in the present application will be described simply below.

Since the area occupied by the direct peripheral circuits can be reduced, a higher degree of integration can be developed in the non-volatile semiconductor memory device.

DETAILED DESCRIPTION OF THE PREFERRED EMBODIMENTS

Figure 1:
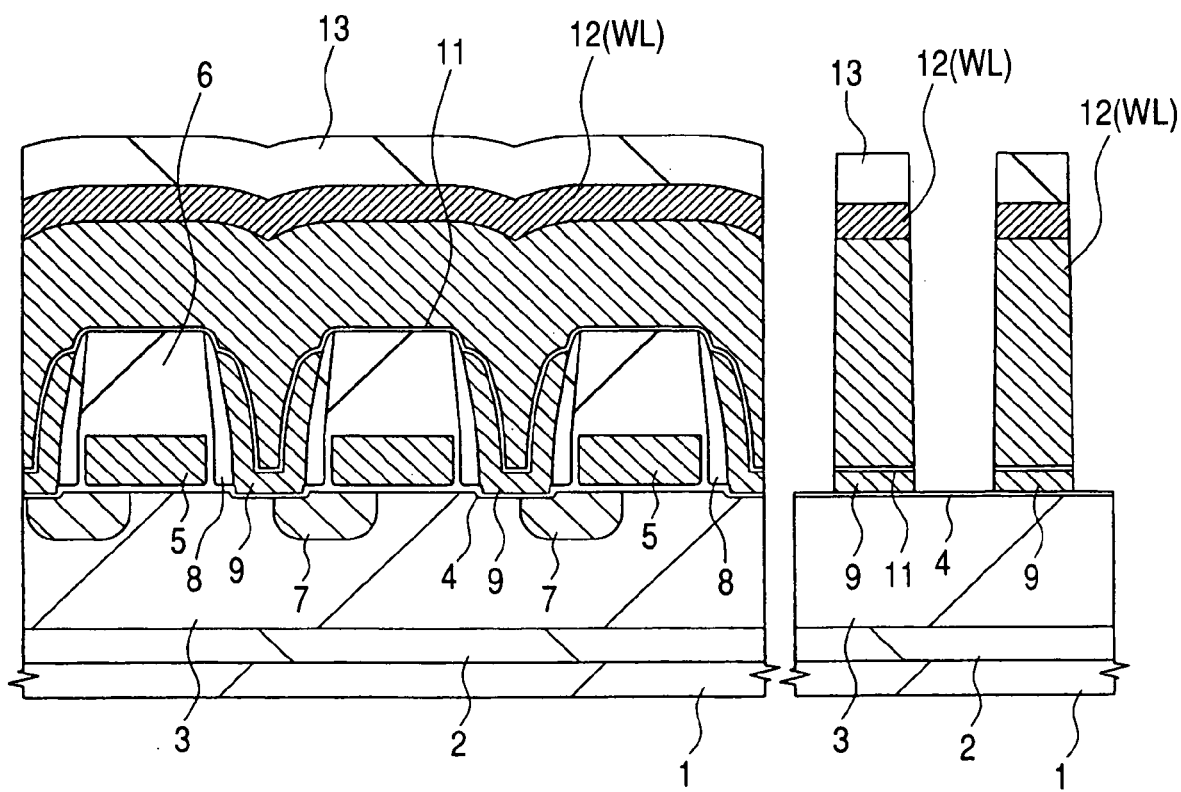
FIG. 1 is a cross sectional view of a semiconductor substrate showing a memory cell of an AND type flash memory representing a preferred embodiment according to the present invention.

The present invention will be described specifically by way of a preferred embodiment with reference to the drawings. Throughout the drawings, identical components are identified the same reference numerals, and duplicate descriptions will be omitted.

FIG. 1 is a cross sectional view of a semiconductor substrate showing a memory cell of an AND type flash memory according to this embodiment. The left part of the drawing is a cross sectional view taken along the extending direction of a word line (direction of a row), and the right part of the drawing is a cross sectional view taken along a direction perpendicular to the extending direction of the word line (direction of a column).

The memory cell is formed in a p-type well 3 of a semiconductor substrate comprising a p-type single crystal silicon (hereinafter simply referred to as a substrate) 1. An n-type well 2 is formed to a layer below the p-type well 3 (triplicate well structure).

Over the p-type well 3, a selection gate 5 is formed by way of a first gate insulating film (tunnel oxide film) 4 comprising silicon oxide serving as an insulating film. Further, a silicon oxide film 6 is formed, for example, as an insulating film over the selection gate 5. The selection gate is formed of a conductive film, and it comprises, for example, an n-type polycrystal silicon film.

An n-type semiconductor region (source, drain) 7, that functions as a local bit line (and local source line) of a memory cell, is formed below one of the side walls of the selection gate 5. For reducing the pitch in the direction of a row, the n-type semiconductor region (source, drain) 7 is used in common between adjacent memory cells in the direction of the row. The n-type semiconductor region (source, drain) 7 is formed by introducing arsenic (As) into the p-type well 3 near one of the side walls of the selection gate by using an oblique ion implantation method.

A float gate 9 (a charge storage layer 9) is formed between the selection gates 5 disposed adjacent to each other so as to cover the side wall of the selection gates. A side wall spacer 8, comprising a silicon oxide film, is formed on the side wall of the selection gate 5 in order to ensure the necessary withstand voltage between the float gate 9 and the selection gate 5.

A control gate 12 is formed by way of a second gate insulating film 11 over the float gate 9. The second gate insulating film 11 is constituted as a stacked insulating film having three layers of insulating films formed by stacking a silicon oxide film, a silicon nitride film and a silicon oxide film; and, the control gate 12 is formed of a conductive film, and it is constituted of a polyside film formed as a stacked film of an n-type polycrystal silicon film and a W (tungsten) film. The control gate 12 extends in the direction of a row to constitute a word line (WL). A silicon oxide film 13 is formed over the control gate 12, and three layers of metal wirings (not illustrated) are formed thereover.

Figure 2:
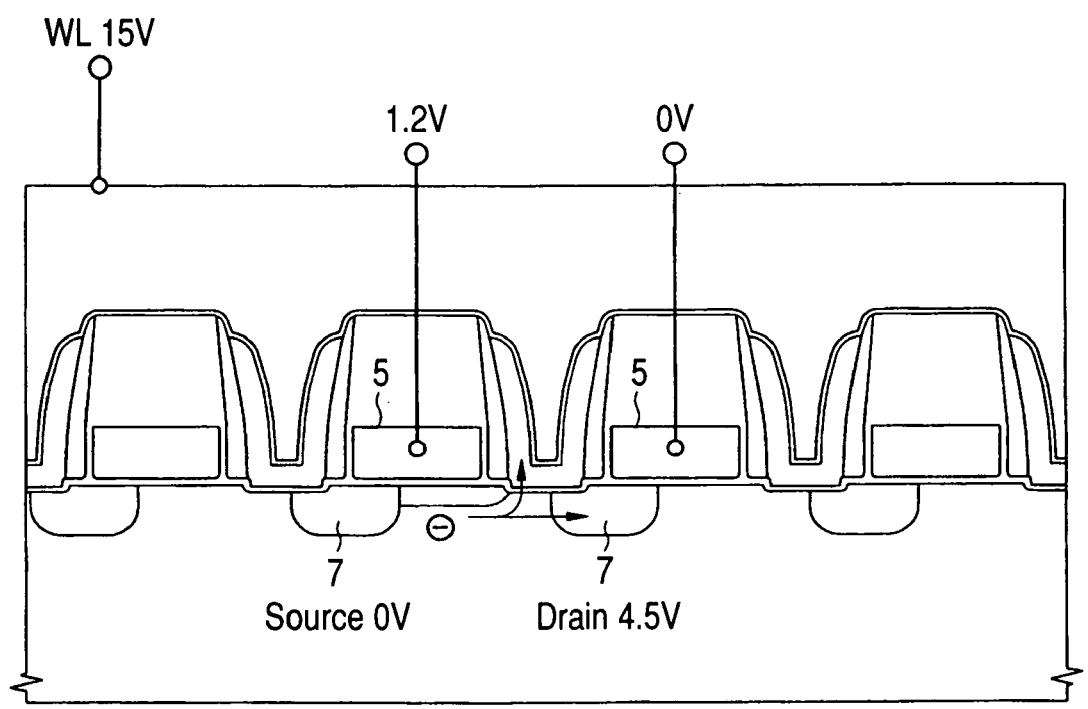
FIG. 2 is a diagrammatic sectional view illustrating the writing operation of the memory cell shown in FIG. 1.

As shown in FIG. 2, in writing information to the memory cell, 15. V is applied to the word line (WL) (0. V to A not-selected word line), 1.2. V is applied to the selection gate 5 (0. V to the other selection gates), 0. V is applied to the n-type semiconductor region (source), and 4.5. V is applied to the n-type semiconductor region (drain) 7 of the adjacent memory cells of the selected memory cell; and, hot electrons generated by current flowing through the channel region below the selection gate 5 are injected through the first gate insulative film 4 to the float gate 9. That is, the selection gate 5 functions as a gate for controlling the channel therebelow.

Such a writing system is referred to as an SSI (Source-Side-Injection) writing method; and, since hot electrons can be generated at high efficiency with this writing method, writing to the memory cell is possible with a small channel current. Accordingly, it is possible to write into plural memory cells in parallel within a range not exceeding the current supply performance of the power source voltage in a chip to increase the writing through-put. In this case, device isolation between the selected memory cell and a not selected memory cell is carried out by the selection gate 5, which is overlapped with the n-type semiconductor region (drain) 7.

In reading information, a voltage is applied at 3.5. V to the selected gate 5, 1. V is applied to the source, and 0. V is applied to the drain, and the threshold value of the memory cell is judged. Device isolation between the selected memory cell and a not-selected memory cell is carried out by the selection gate 5 similar to that in the writing of information.

In erasing information, a voltage is applied at −18. V to the selected word line (WL), 0. V is applied to the source, 0. V is applied to the drain and 0. V is applied to the selected gate 5. This causes electrons to be emitted from the float gate 9 to the p-type well 3, thereby to lower the threshold value.

Figure 3:
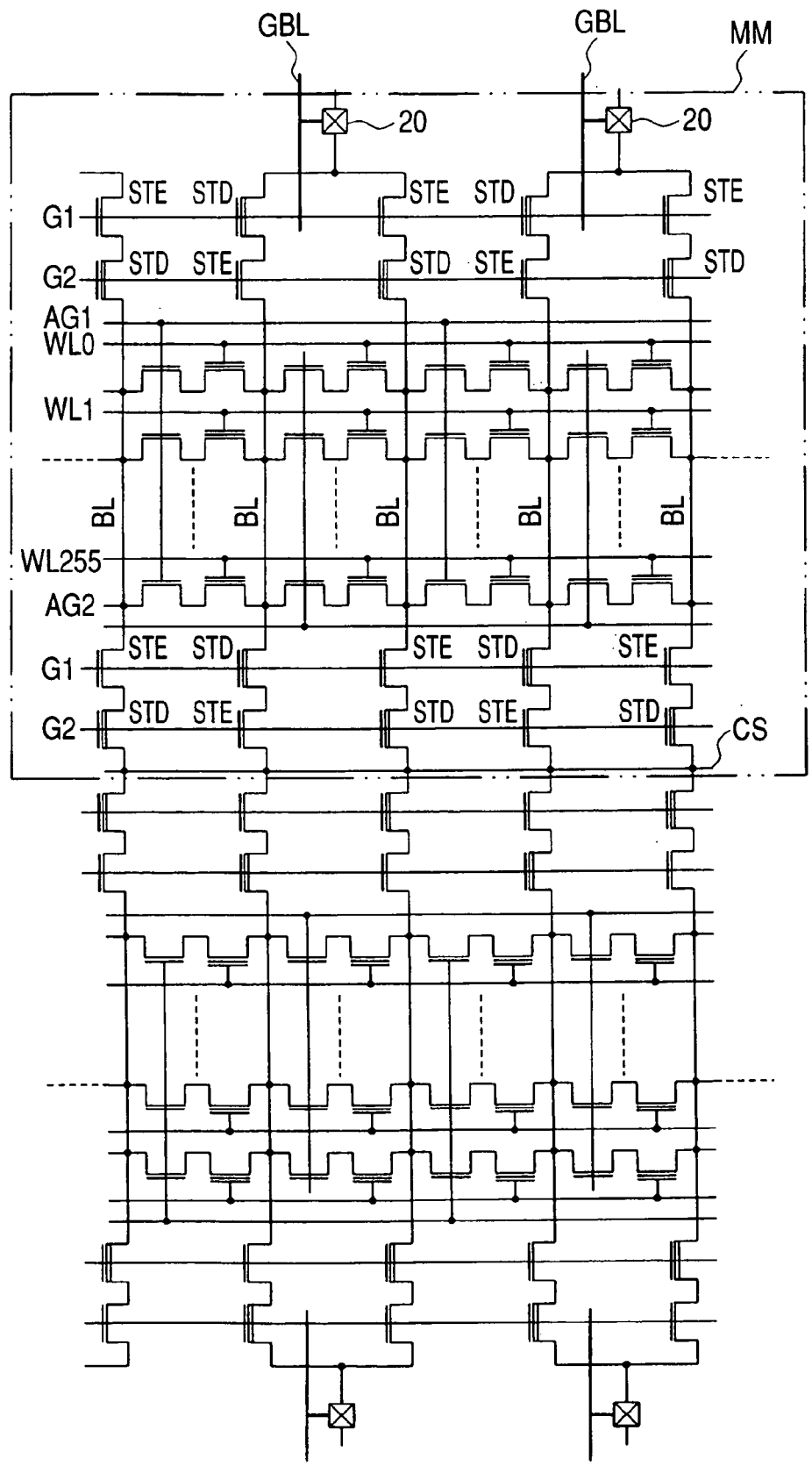
FIG. 3 is a schematic circuit diagram of the AND type flash memory representing a preferred embodiment according to the invention.

FIG. 3 is a schematic circuit diagram showing an AND type flash memory according to this embodiment. Memory cells as shown in FIG. 1 are arranged in a matrix to form a memory array on the substrate. The memory array is constituted of a memory mat MM having word lines WL ($WL_0$, $WL_1$, —$WL_{255}$) extending in the direction of a row (in the right-to-left direction of the drawing) arranged, for example, as 256. rows along the direction of a column (vertical direction in the drawing) as a basic unit. This memory mat MM and another memory MM adjacent thereto in the direction of the columns are constituted each with a pattern that is reversed relative to each other, and the plural memory mats MM formed by the repeated pattern are arranged in the direction of a column.

The control gate (12) for the memory cell extends in the direction of a row to constitute a word line WL. As described above, while the number of word lines WL connected in one memory mat MM is 256. ($WL_0$, $WL_1$, —$WL_{255}$), two word lines located on both ends in the direction of a column of the memory mat MM ($WL_0$, $WL_{256}$) are dummy word lines. Since the word lines at the ends of the memory mat MM each includes a large dimensional shift by fabrication, they are not used as a memory cell, by which a fluctuation of the characteristics of the memory mat MM can be decreased.

The selection gates (5) of the memory cell extend in the direction of a column perpendicular to the word lines WL, and they are bundled on every other one at upper or lower portions of the memory mat MM and connected with a metal wiring ($AG_1$. or $AG_2$).

The n-type semiconductor regions (7) of the memory cell extend in the direction of a column to constitute a local bit line BL. In order to reduce the pitch in the direction of the column, the n-type semiconductor region (7) is used in common with adjacent memory cells and functions as a bit line or a source line.

The AND type flash memory of this embodiment adopts a constitution in which a pair of local bit lines BL disposed adjacent with each other, among the local bit lines BL described above, are connected with one global bit line GBL on one end in the direction of a column of the memory mat MM. The global bit line GBL is constituted of a metal wiring having a lower resistance than that of the n-type semiconductor regions (7) constituting the local bit lines BL. In the drawing, reference numeral 20 denotes a contact hole for connecting the local bit line BL with a global bit line GL.

A selection MOS transistor, comprising one enhancement type MOS transistor (STE) and one depletion type MOS transistor (STD), is connected in series with each of the pair of local bit lines BL, such that one of the local bit lines BL is selected depending on the on/off state of the selection MOS transistor. Each of the enhancement type MOS transistor (STE) and the depletion type MOS transistor (STD) is constituted of an n-channel type MOS transistor.

The enhancement type MOS transistor (STE) of one local bit line BL has a gate ($G_1$) in common with the depletion type MOS transistor (STD) of the other local bit line BL, while the enhancement type MOS transistor (STE) of the other local bit line BL has a gate ($G_2$) in common with the depletion type MOS transistor (STD) of one local bit line BL. Since the depletion type MOS transistor (STD) connected to each local bit line BL is always on, one of the local bit lines BL is selected by on/off switching of the gates ($G_1$) and ($G_2$). The respective other ends of the local bit lines BL are connected by way of selection MOS transistors, having the same constitution as described above, to a common source line CS.

As described above, by adopting the system of serially connecting one enhancement type MOS transistor (STE) and one depletion type MOS transistor (STD) to a pair of local bit lines BL, thereby selecting the local bit line BL, since wirings for connecting the two MOS transistors and the space for forming a contact hole are no longer necessary, the area occupied by the selection MOS transistor can be reduced.

Figure 4:
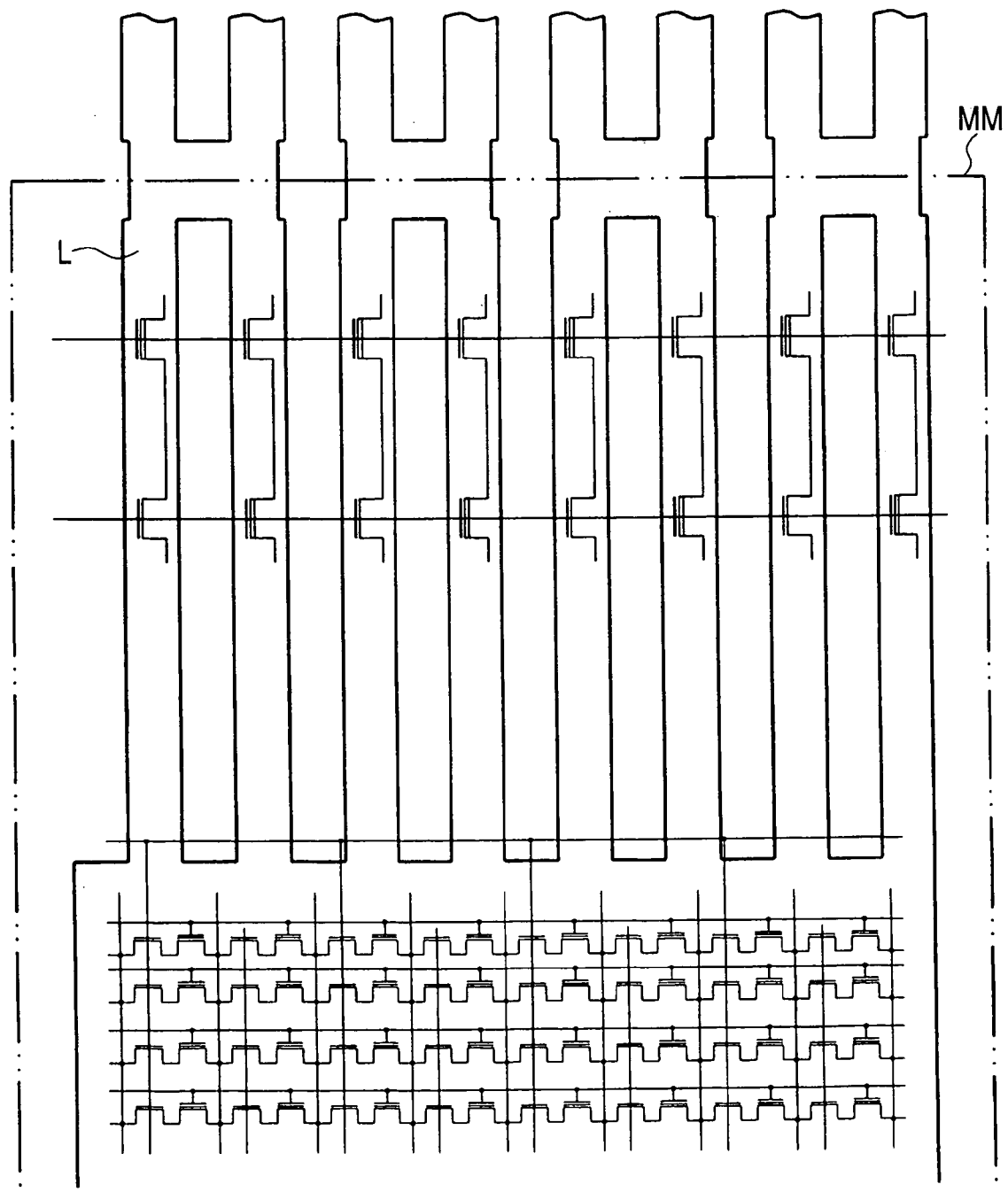
FIG. 4 is a diagrammatic plan view schematically showing a pattern for an active region in the vicinity of one end in the direction of the column of a memory mat.

FIG. 4 is a plan view showing a pattern for an active region near one end, in the direction of a row, of a memory mat MM. A region depicted by reference L in the drawing is an active region, and a region surrounding the active region L is a device isolation region. The device isolation region is constituted by a so-called STI (Shallow Trench Isolation) structure formed by burying a silicon oxide film inside a trench formed by etching the substrate. An enhancement type MOS transistor (STE) and a depletion type MOS transistor (STD) for selecting a local bit line BL are formed in a comb-like elongate active region L extending in the direction of a column from the end of the active region L in which the memory cell is formed. As described above, since the device isolation between the selected memory cell and a not-selected memory cell is carried out by the selection gate 5, the device isolation region is not formed to the substrate 1 in a region where the memory cell is formed.

Figure 5:
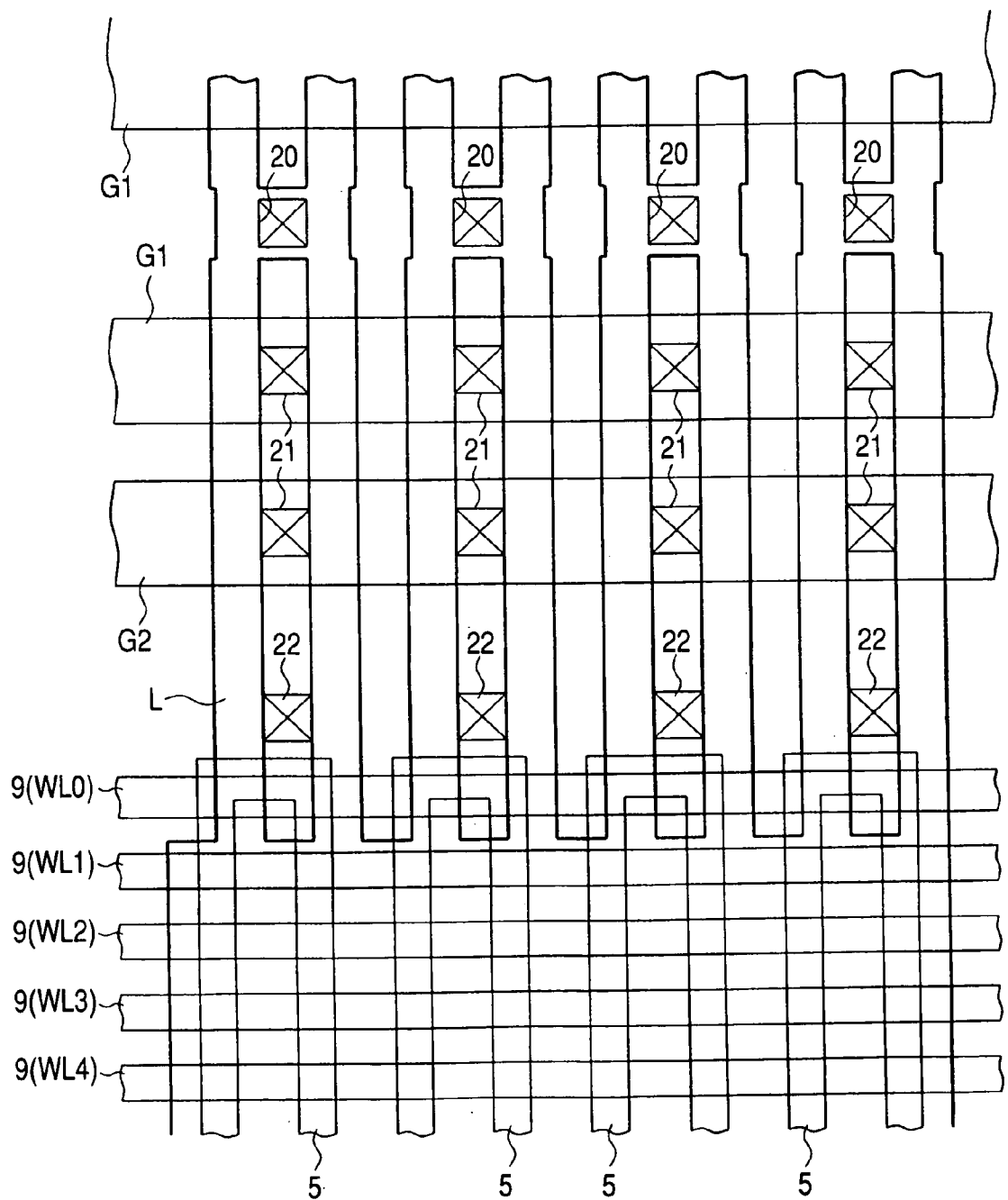
FIG. 5 is a diagrammatic plan view schematically showing the state of a memory cell, an enhancement type MOS transistor and a depletion type MOS transistor in the region shown in FIG. 4.

FIG. 5 is a plan view schematically showing the state of forming a memory cell, enhancement type MOS transistors (STE) and depletion type MOS transistors (STD) to the region shown in FIG. 4 (near one end in the direction of a column of the memory mat MM).

In the drawing, reference numeral 21 denotes a contact hole in which metal wirings (not illustrated) for supplying current to the gates ($G_1$), ($G_2$) of the enhancement type MOS transistor (STE) and the depletion type MOS transistor (STD) are connected. Further, reference numeral 22 denotes a contact hole in which metal wirings (not illustrated) for supplying current to the selection gates 5 are bundled on the end of the memory mat MM.

As described above, the reference numeral 20 denotes a contact hole for connecting a local bit line BL and a global bit line GBL. As shown in the drawing, the contact hole 20 is located in a region where the active region L of one memory mat MM and the active region L of another memory mat MM that is disposed adjacent in the direction of a column are connected. That is, the AND type flash memory of this embodiment comprises a constitution in which four local bit lines BL joining a pair of local bit lines BL in one memory mat MM and a pair of local bit lines BL in another memory mat MM adjacent thereto are connected through one contact hole 20. This can reduce the area occupied by the contact hole 20 for connecting the local bit line BL and the global bit line GBL.

As described above, according to this embodiment, since the area occupied by the selection MOS transistor for selecting one of the pair of local bit lines BL can be reduced, and the area occupied by the contact hole for connecting the local bit line BL and the global bit line GBL can be reduced, the ratio of occupation of the direct peripheral circuits can be reduced, thereby to enhance the higher integration of the AND type flash memory.

Figure 6:
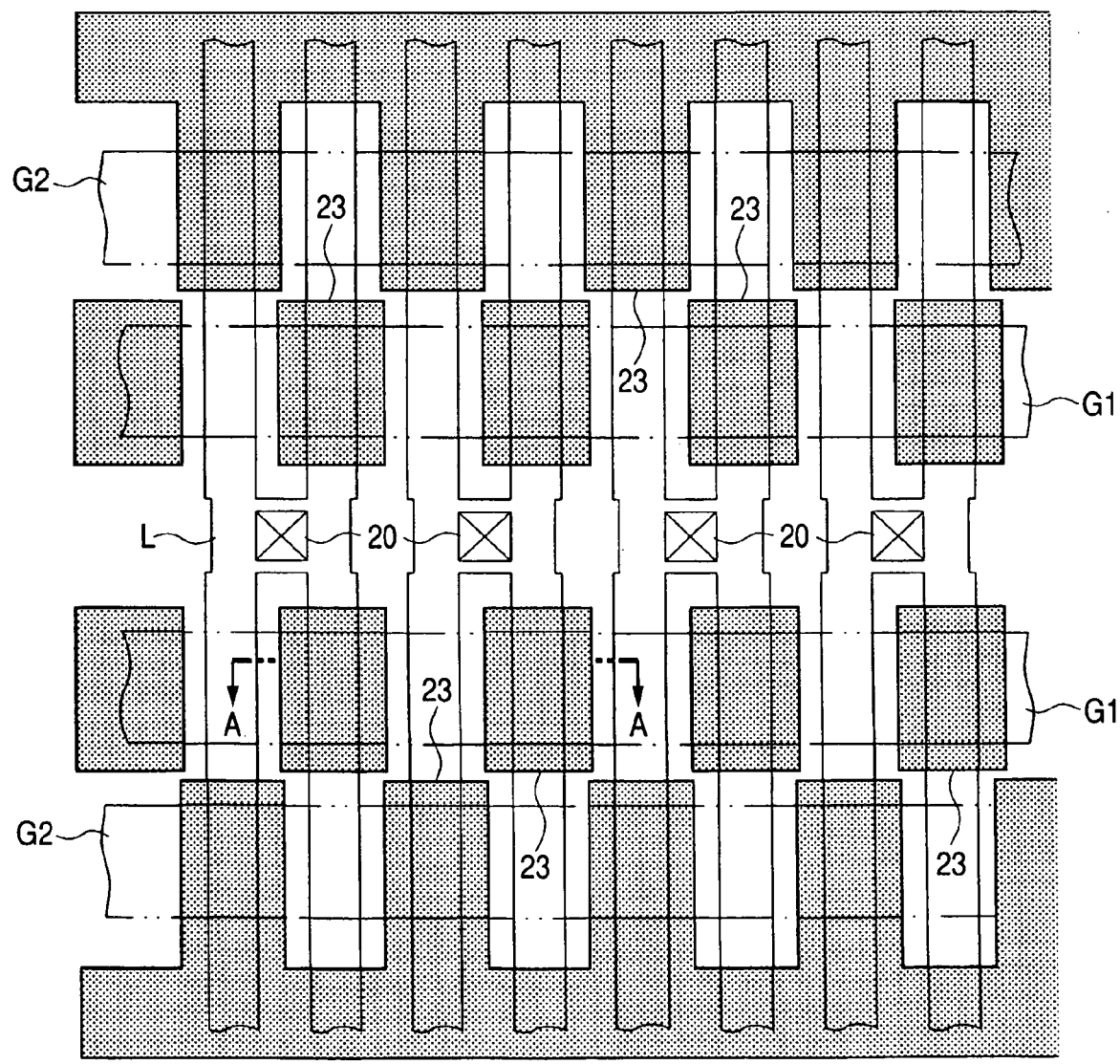
FIG. 6 is a diagrammatic plan view of the memory mat end showing steps in the manufacture of an enhancement type MOS transistor and a depletion type MOS transistor.

FIG. 6 is a plan view of the end of a memory mat MM showing steps in the manufacture of an enhancement type MOS transistor (STE) and a depletion type MOS transistor (STD). A portion shown below the contact hole 20, which is shown at the central portion in the drawing (contact hole for connecting local bit line BL and global bit line GBL), represents a region for forming the selection MOS transistor of one memory mat MM, while a portion above the contact hole 20 as seen in the drawing represents a region for forming the selection MOS transistor of an adjacent memory mat MM.

For forming the enhancement type MOS transistor (STE) and the depletion type MOS transistor (STD), a photoresist film 23, in which a channel region of the depletion type MOS transistor (STD) is opened, is formed over the substrate in this region. The photoresist film 23 is formed in a region where the gate ($G_1$) is formed in a subsequent step so as to cover every alternative one of the active regions L in the extending direction of the gate ($G_1$). In the same manner, the photoresist film 23 is formed also in the region where the gate ($G_2$. is formed in a subsequent step so as to cover every alternate one of the active regions L in the extending direction of the gate ($G_2$). Further, the photoresist film 23 is formed in the region where the gate ($G_1$) is formed and in the region where the gate ($G_2$) is formed so as to have the shape of a sash cord opening, as seen in the drawing.

Then, as an impurity exhibiting an n-type conductivity, for example, arsenic is ion implanted to the active region L using the photoresist film 23 as a mask. That is, the ion implantation is carried out in the region where the gate ($G_1$) is formed in a subsequent step on every alternative one of the active regions L in the extending direction of the gate ($G_1$). In the same manner, ion implantation is conducted on every alternate one of the active regions L in a region where the gate ($G_2$) is formed in a subsequent step in the extending direction of the gate ($G_2$). That is, ion implantation is conducted in the region where the gate ($G_1$) is formed and in the region where the gate ($G_2$) is formed so as to have the shape of a sash cord opening.

Accordingly, since the threshold voltage of the n-channel MOS transistor formed in the region where arsenic is ion implanted is lowered to 0. V or lower, it operates as a depletion type MOS transistor (STD). Further, an n-channel MOS transistor formed in a region covered with the photoresist film 23, that is, a region where arsenic is not ion implanted, operates as an enhancement type MOS transistor (STE). In the drawing, while the gates ($G_1$), ($G_2$) for the enhancement type MOS transistor (STE) and the depletion type MOS transistor (STD) and the contact hole 20 are illustrated to make the arsenic ion implantation region easy to see, actual ion implantation is conducted before the step of forming the gates ($G_1$), ($G_2$) and the contact hole 20.

Figure 7:
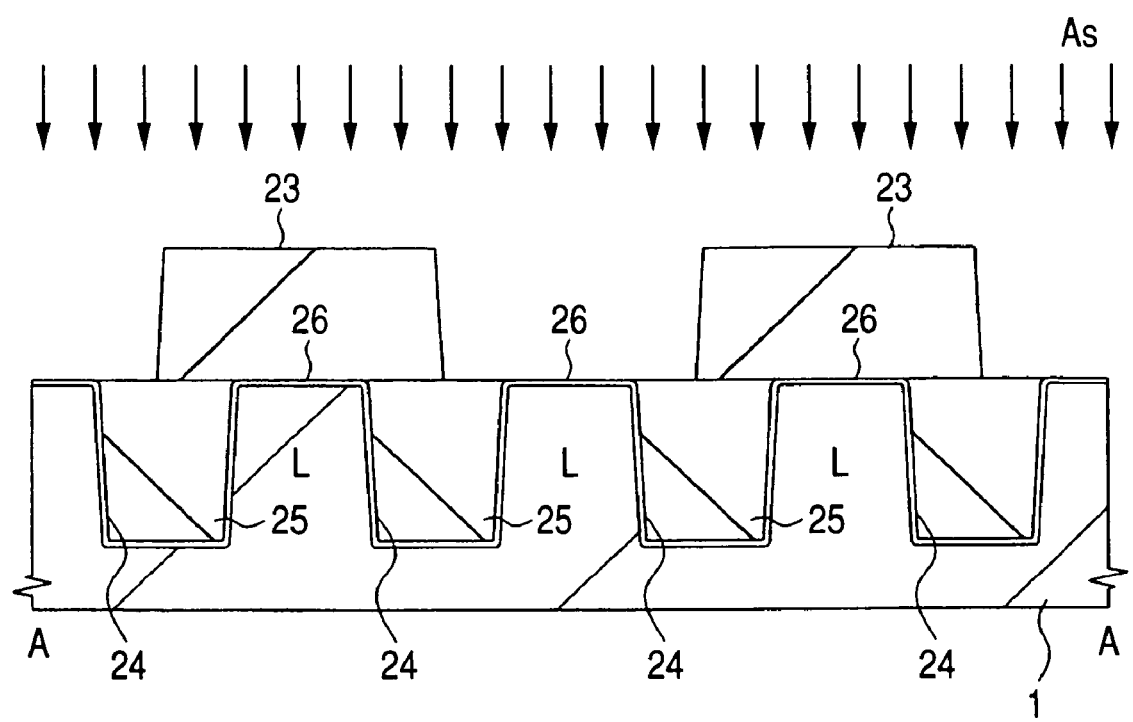
FIG. 7 is a cross sectional view of a semiconductor substrate taken along line A—A in FIG. 6.

FIG. 7 is a cross sectional view of a semiconductor substrate 1 showing the implantation step (cross sectional view taken along line A—A in FIG. 6). As shown in the drawing, active regions L and element isolation trenches 24 are formed alternately, each at a narrow distance along the direction of the row. Each of the width for the active region L, the width for the element isolation trench 24 and the distance therebetween along the direction of the row is about 0.2. µm. A silicon oxide film 25 is buried inside the element isolation trench 24.

In the step of manufacturing an AND type flash memory, a element isolation trench 24 is at first formed to a substrate 1; and, successively, after forming a silicon oxide film (through oxide film) 26 for Ion Implantation over the surface of the substrate 1, ion Implantation is carried out for forming the well (n-type well 2 and p-type well 3). Then, a photoresist film 23 is formed over the substrate 1; and, after ion implantation of arsenic, the photoresist film 23 is removed, and, successively, the substrate 1 is subjected to a heat treatment to diffuse the impurities in the substrate 1, thereby forming the n-type well 2 and the p-type well 3. Then, after removing the silicon oxide film 26 by wet etching, the substrate 1 is again subjected to a heat treatment to form a first gate insulating film 4 on the surface thereof, and a selection gate 5 is formed over the first gate insulating film 4.

By the way, in the arsenic ion implantation step shown in FIG. 6 and FIG. 7, since the surface of the element isolation trench 24, which is adjacent to the active region L into which arsenic is to be introduced, is covered by the photoresist film 23, arsenic is not introduced to the surface of the silicon oxide film 25 that is buried in the element isolation trench 24. However, since the width of the active region L, the width of the element isolation trench 24 and the distance therebetween is extremely narrow in the selection MOS transistor forming region, when the entire surface of the element isolation trench 24 is intended to be covered by the photoresist film 23, a space can not be ensured with respect to the adjacent photoresist film 23. Accordingly, as shown in FIG. 7, the photoresist film 23 is formed to a minimum fabrication size so as to expose the end of the element isolation trench 24. Accordingly, when arsenic is ion implanted by using the photoresist film 23 as a mask, arsenic is implanted also to the silicon oxide film 25 at the end of the element isolation trench so as to form a damage layer on the surface. As a result, when the silicon oxide film (through oxide film) 26 is removed by wet etching in the next step, the silicon oxide film 25 at the end of the element isolation trench 24 is etched excessively to form pits on the surface. When such a phenomenon occurs, the thickness of the first gate insulative film that is formed over the surface of the substrate 1 in the active region L is locally decreased at the end of the active region L so as to bring about a phenomenon in which a drain current flows even at a low gate voltage (referred to as a kink characteristic), thereby to deteriorate the characteristics of the selection MOS transistor. Further, when a polycrystal silicon film deposited over the substrate 1 is etched to form the gates ($G_1$), ($G_2$) of the selection MOS transistor, since etching residues of the polycrystal silicon film are formed along the end of the element isolation trench 24, this results in a short circuit failure between the gate ($G_1$) and the gate ($G_2$).

As a countermeasure, in this embodiment, after removing the photoresist film 23 that is used as the ion implantation mask for arsenic, the substrate 1 is subjected to a heat treatment in a non oxidizing atmosphere, for example, of nitrogen, prior to the step of wet etching the silicon oxide film (through oxide film) 26. By use of this heat treatment, damage to the silicon oxide film 25 formed by the arsenic ion implantation is recovered to form a dense film. As a result, when the silicon oxide film (through oxide film) 26 is then wet etched, since it is possible to suppress excess etching to the silicon oxide film 25 at the end of the element isolation trench 24 and thereby to suppress the formation of pits, deterioration of the characteristics of the selection MOS transistor or short circuit failure between the gates ($G_1$) and ($G_2$) can be prevented.

Subsequently, the selection gate 5 and the first gate insulative film 4 of the selection MOS transistor (enhancement type MOS transistor (STE) and depletion type MOS transistor (STD)) shown in FIG. 1 are formed over the substrate 1. The first gate insulative film 4 can be formed, for example, by applying a thermal oxidation treatment to the substrate 1.

The invention made by the present inventors has been described above specifically based on a preferred embodiment, but it will be apparent that the invention is not restricted to the preferred embodiment and can be modified variously within a range not departing the gist thereof.

The present invention is directed to a technique that is useful to achieve a higher integration of a non-volatile semiconductor memory device.

What is claimed is:

1. A non-volatile semiconductor memory device, comprising:
    plural memory cells situated at respective intersections of plural word lines extending in a first direction of a memory mat and plural local bit lines extending in a second direction, perpendicular to the first direction,
    wherein one end of each of two local bit lines that are disposed adjacent to each other, among the plural local bit lines, are connected with one global bit line at the end of the memory mat, and one of the two local bit lines that are adjacent to each other is selected by a selection MOS transistor connected to each of the plural local bit lines, and
    wherein plural memory mats, each having an identical constitution, are situated along the second direction, and two local bit lines, which are adjacent to each other and are formed in one of the memory mats, and two local bit lines, which are adjacent to each other and are formed in another memory mat, are connected with one global bit line at the boundary between the two memory mats.

2. A non-volatile semiconductor memory device according to claim 1, wherein the local bit lines are constituted of a diffusion layer formed to a semiconductor substrate, and the global bit line is constituted of a metal wiring.

3. A non-volatile semiconductor memory device according to claim 1, wherein a selection MOS transistor is connected to each of the plurality of local bit lines and comprises one enhancement type MOS transistor and one depletion type MOS transistor connected in series to each other, and the enhancement type MOS transistor and the depletion type MOS transistor are arranged opposite to each other between one and the other of two local bit lines that are adjacent to each other.

4. A non-volatile semiconductor memory device according to claim 1,
    wherein each of the local bit lines comprises a diffusion region at a principal surface of a semiconductor substrate, and the global bit line comprises a metal wiring.

5. A non-volatile semiconductor memory device according to claim 1,
    wherein each of the local bit lines comprises a diffusion region at a principal surface of a semiconductor substrate, and the global bit line comprises a metal wiring.

6. A non-volatile semiconductor memory device comprising: plural memory cells situated at respective intersections of plural word lines extending in a first direction of a memory mat and plural local bit lines extending in a second direction, perpendicular to the first direction,
    wherein each of the plural memory cells comprises:
    a selection gate formed by way of a first insulating film over the main surface of a first conductivity type semiconductor substrate;
    a source and a drain comprising a second conductivity type semiconductor region formed to the semiconductor substrate and constituting a local bit line;
    a float gate insulated at a portion thereof from the source and drain by a tunnel oxide film and insulated at another portion thereof from the selection gate by a second insulating film; and
    a control gate formed by way of a third insulating film over the float gate and constituting a word line, and
    wherein plural local bit lines are connected respectively such that one end of two local bit lines, that are disposed adjacent to each other, are connected to one global bit line at one end of a memory mat, and one of the two local bit lines, that are adjacent to each other, is selected by a first selection MOS transistor connected to each of the plural local bit lines.

7. A non-volatile semiconductor memory device according to claim 6, wherein plural memory mats, each having an identical constitution, are situated along the second direction, and two local bit lines, which are adjacent to each other and are formed in one memory mat, among two memory mats, that are adjacent to each other, and two local bit lines, that are adjacent to each other and are formed in another memory mat, are connected with one global bit line at the boundary between the two memory mats.

8. A non-volatile semiconductor memory device according to claim 6, wherein the global bit line is constituted of metal wiring having a resistance lower than that of the local bit line.

9. A non-volatile semiconductor memory device according to claim 6, wherein a first selection MOS transistor is connected to each of the plural local bit lines and comprises one enhancement type MOS transistor and one depletion type MOS transistor connected in series to each other, and the enhancement type MOS transistor and the depletion type MOS transistor are arranged opposite to each other between one and the other of two local bit lines that are adjacent to each other.

10. A non-volatile semiconductor memory device according to claim 6, wherein the source and the drain are formed below one of the side walls of the selection gate and are disposed in common between two memory cells that are adjacent in the extending direction of a word line.

11. A non-volatile semiconductor memory device according to claim 6, wherein writing of information into the memory cell is conducted by injecting hot electrons generated by a current flowing through a channel region below a selection gate to the float gate by way of the first tunnel oxide film.

12. A non-volatile semiconductor memory device according to claim 6, wherein respective selection gates of plural memory cells are bundled to each other at the end of a memory mat.

13. A non-volatile semiconductor memory device according to claim 6, wherein respective other ends of the plural local bit lines are connected by way of a second selection MOS transistor with a common source line on the other end of a memory mat.

14. A non-volatile semiconductor memory device comprising:
  plural memory cells situated at respective intersections of plural word lines extending in a first direction of a memory mat and plural local bit lines extending in a second direction, perpendicular to the first direction,
  wherein one end of each of two local bit lines that are disposed adjacent to each other, among the plural local bit lines, are connected with one global bit line at the end of the memory mat, and one of the two local bit lines that are adjacent to each other is selected by a selection MOS transistor connected to each of the plural local bit lines, and
  wherein a selection MOS transistor is connected to each of the plurality of local bit lines and comprises one enhancement type MOS transistor and one depletion type MOS transistor connected in series to each other, and the enhancement type MOS transistor and the depletion type MOS transistor are arranged opposite to each other between one and the other of two local bit lines that are adjacent to each other.

15. A non-volatile semiconductor memory device according to claim 14,
  wherein the local bit lines are constituted of a diffusion layer formed to a semiconductor substrate, and the global bit line is constituted of a metal wiring.

16. A non-volatile semiconductor memory device according to claim 15,
  wherein plural memory mats, each having an identical constitution, are situated along the second direction, and two local bit lines, which are adjacent to each other and are formed in one of the memory mats, and two local bit lines, which are adjacent to each other and are formed in another memory mat, are connected with one global bit line at the boundary between the two memory mats.

17. A non-volatile semiconductor memory device according to claim 15,
  wherein plural memory mats, each having an identical constitution, are situated along the second direction, and two local bit lines, which are adjacent to each other and are formed in one of the memory mats, and two local bit lines, which are adjacent to each other and are formed in another memory mat are connected with one global bit line at the boundary between the two memory mats.

* * * * *